United States Patent
Arai et al.

(10) Patent No.: US 8,674,644 B2
(45) Date of Patent: Mar. 18, 2014

(54) MOTOR DRIVE CIRCUIT

(75) Inventors: Takeshi Arai, Gunma-ken (JP); Akira Suzuki, Gunma-Ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 250 days.

(21) Appl. No.: 13/330,983

(22) Filed: Dec. 20, 2011

(65) Prior Publication Data

US 2012/0161687 A1    Jun. 28, 2012

(30) Foreign Application Priority Data

Dec. 24, 2010   (JP) ................................ 2010-288397

(51) Int. Cl.
*G05B 13/00*      (2006.01)

(52) U.S. Cl.
USPC ............. 318/619; 318/561; 318/460; 360/75; 360/78.04; 360/77.02

(58) Field of Classification Search
USPC ............. 318/561, 619, 460, 400.34; 388/803, 388/806, 805, 809; 360/75, 55, 78.04
See application file for complete search history.

(56) References Cited

U.S. PATENT DOCUMENTS

| | | | |
|---|---|---|---|
| 4,963,806 A | | 10/1990 | Shinohara et al. |
| 5,465,035 A | * | 11/1995 | Scaramuzzo et al. ......... 318/561 |
| 6,014,285 A | | 1/2000 | Okamura |
| 6,154,340 A | * | 11/2000 | Cameron ........................ 360/75 |
| 6,567,230 B1 | * | 5/2003 | Kagami et al. ................. 360/75 |
| 6,765,749 B2 | * | 7/2004 | Galloway et al. .......... 360/78.04 |
| 6,898,164 B2 | * | 5/2005 | Kadlec et al. .............. 369/53.28 |
| 7,158,335 B2 | * | 1/2007 | Park et al. ................... 360/77.02 |
| 7,271,972 B1 | | 9/2007 | Pham et al. |
| 7,583,468 B2 | | 9/2009 | Sharma et al. |
| 7,602,572 B2 | * | 10/2009 | Abrishamchian et al. ...... 360/75 |
| 8,401,735 B2 | * | 3/2013 | Muragishi et al. .............. 701/37 |
| 8,503,124 B2 | * | 8/2013 | Uchida et al. ................... 360/55 |

FOREIGN PATENT DOCUMENTS

| | | |
|---|---|---|
| JP | 2005063362 A | 3/2005 |
| JP | 2008-178206 A | 7/2008 |
| KR | 2006-0049900 A | 5/2006 |

OTHER PUBLICATIONS

Office Action issued in corresponding Korean Application No. 10-2011-141047 dated Jan. 9, 2013, and English translation thereof (8 pages).
Extended European Search Report issued in European Application No. 11194699.2 dated Jul. 4, 2012, 9 pages.

* cited by examiner

*Primary Examiner* — Rita Leykin
(74) *Attorney, Agent, or Firm* — Osha Liang LLP

(57) ABSTRACT

A motor-drive circuit includes: a filter circuit to attenuate a frequency band including a resonance frequency of an actuator in a target-current signal, the target-current signal corresponding to a digital signal indicative of a target value of a driving current; a digital-analog converter to convert an output signal of the filter circuit into an analog signal, to be outputted as a current-control signal; and a driving circuit to supply the driving current to the voice-coil motor in accordance with the current-control signal, the filter circuit including: a digital notch filter; and a digital low-pass filter, wherein either one of the digital notch filter and the digital low-pass filter configured to be inputted with the target-current signal, the other one of the digital notch filter and the digital low-pass filter configured to be inputted with an output signal of the one of the digital notch filter or the digital low-pass filter.

16 Claims, 9 Drawing Sheets

MOTOR DRIVE CIRCUIT

CROSS-REFERENCE TO RELATED APPLICATION

This application claims the benefit of priority to Japanese Patent Application No. 2010-288397, filed Dec. 24, 2010, of which full contents are incorporated herein by reference.

BACKGROUND OF THE INVENTION

1. Field of the Invention

The present invention relates to a motor drive circuit.

2. Description of the Related Art

With respect to a linear motor configured to drive an actuator to perform positioning of a magnetic head of a hard disc drive, a voice coil motor is generally known that produces thrust by passing an electric current through a coil in a magnetic field of a permanent magnet. Recently, there have been portable terminals such as cellular phones and notebook personal computers equipped with camera modules in which the voice coil motors may be used to perform auto-focusing control and optical zoom control in order to reduce the sizes of the modules.

For example, Japanese Patent Laid-Open Publication No. 2008-178206 discloses an actuator drive device capable of reducing vibration of a movable part by changing a drive current of the voice coil motor at a certain gradient in a time period which is a substantially natural-number multiple of the natural frequency period of the movable part.

As such, the position of the movable part of the actuator can swiftly be stabilized by supplying to the voice coil motor the drive current having a ramp waveform which changes at a certain gradient.

The natural frequency period, however, varies with the configuration of the actuator, and the actuator drive device of Japanese Patent Laid-Open Publication No. 2008-178206 requires that the time period in which the drive current is ramped up should be set longer as the natural frequency (resonance frequency) becomes lower.

For this reason, the convergence time, in which the vibration of the actuator has converged and the position of the moving part has been stabilized, may become longer, so that the response speed required for the module to be used may not be satisfied.

SUMMARY OF THE INVENTION

A motor drive circuit according to an aspect of the present invention, includes: a filter circuit configured to attenuate a frequency band including a resonance frequency of an actuator in a target current signal, the target current signal corresponding to a digital signal indicative of a target value of a driving current to be supplied to a voice coil motor configured to drive the actuator; a digital-analog converter configured to convert an output signal of the filter circuit into an analog signal, to be outputted as a current control signal; and a driving circuit configured to supply the driving current to the voice coil motor in accordance with the current control signal, the filter circuit including: a digital notch filter configured to attenuate a frequency band around the resonance frequency in the input signal; and a digital low-pass filter configured to attenuate a frequency band greater than or equal to a predetermined frequency in the input signal, the predetermined frequency corresponding to a frequency lower than the resonance frequency, either one of the digital notch filter and the digital low-pass filter configured to be inputted with the target current signal, an other one of the digital notch filter and the digital low-pass filter configured to be inputted with an output signal of the one of the digital notch filter or the digital low-pass filter.

Other features of the present invention will become apparent from descriptions of this specification and of the accompanying drawings.

BRIEF DESCRIPTION OF THE DRAWING

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

===Configuration of Motor Drive Circuit===

A configuration of a motor drive circuit according to an embodiment of the present invention will be described with reference to FIGS. 1 and 2.

Figure 1:
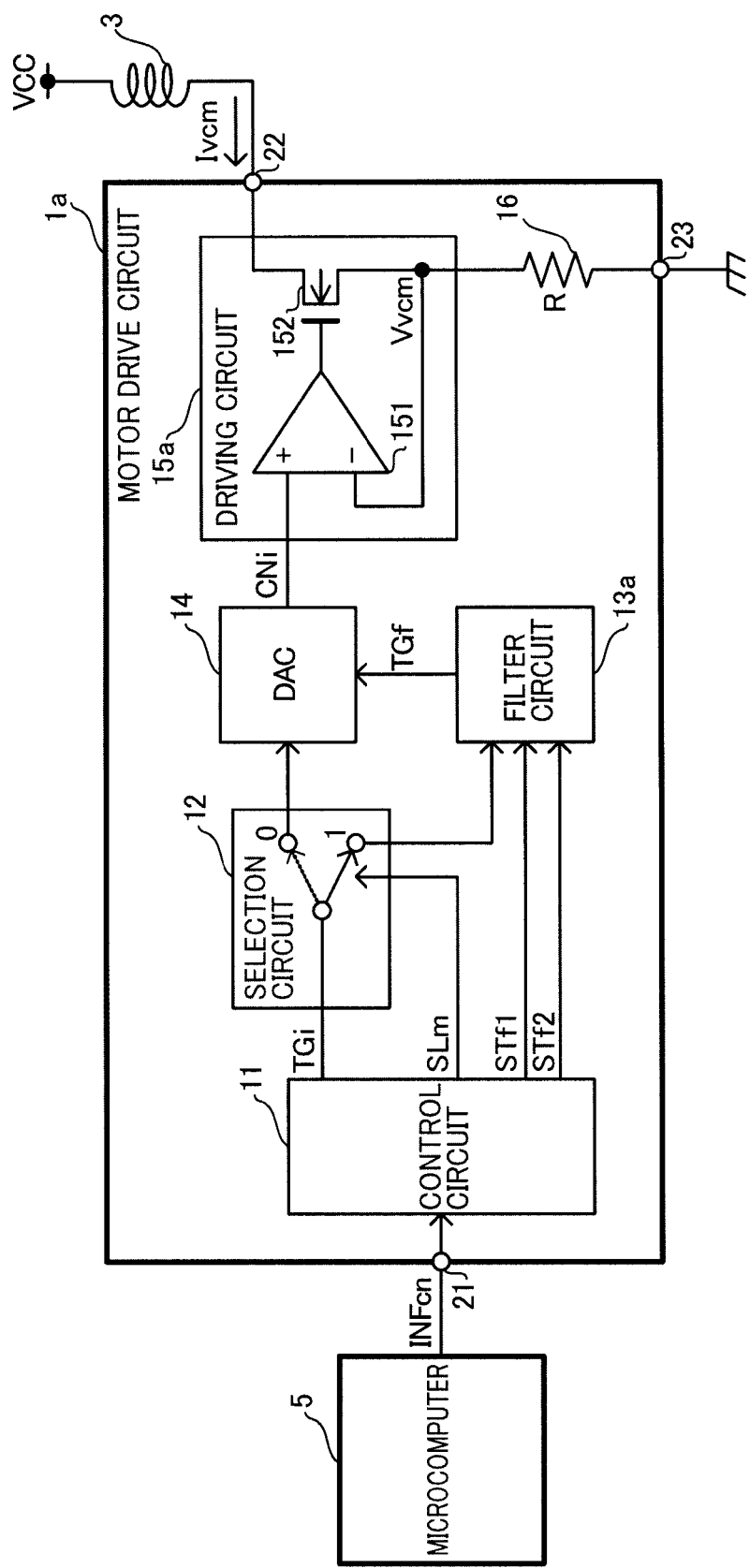
FIG. 1 is a circuit block diagram illustrating a configuration of a motor drive circuit according to an embodiment of the present invention.

A motor drive circuit 1a illustrated in FIG. 1 is a circuit configured to supply a driving current Ivcm to a voice coil motor 3 that is configured to drive an actuator under control of a microcomputer 5, and is configured as an integrated circuit provided with terminals 21 to 23. The motor drive circuit 1a includes a control circuit 11, a selection circuit 12, a filter circuit 13a, a DAC (Digital-Analog Converter) 14, a driving circuit 15a, and a resistor 16. The resistor 16 may be externally connected to the terminal 23. It is preferable that the motor drive circuit 1a is integrated to be formed on one semiconductor substrate.

Control information INFcn is inputted to the control circuit 11 from the microcomputer 5 through the terminal 21. A target current signal TGi, a mode selection signal SLm, and filter setting information STf1 and STf2 are outputted from the control circuit 11.

The selection circuit 12 is configured as a multiplexer with one input and two outputs, and the mode selection signal SLm is inputted to a selection control input. The target current signal TGi is inputted to a data input. The target current signal TGi is inputted to the DAC 14 and the filter circuit 13a from outputs corresponding to SLm=0 and 1, respectively.

Figure 2:
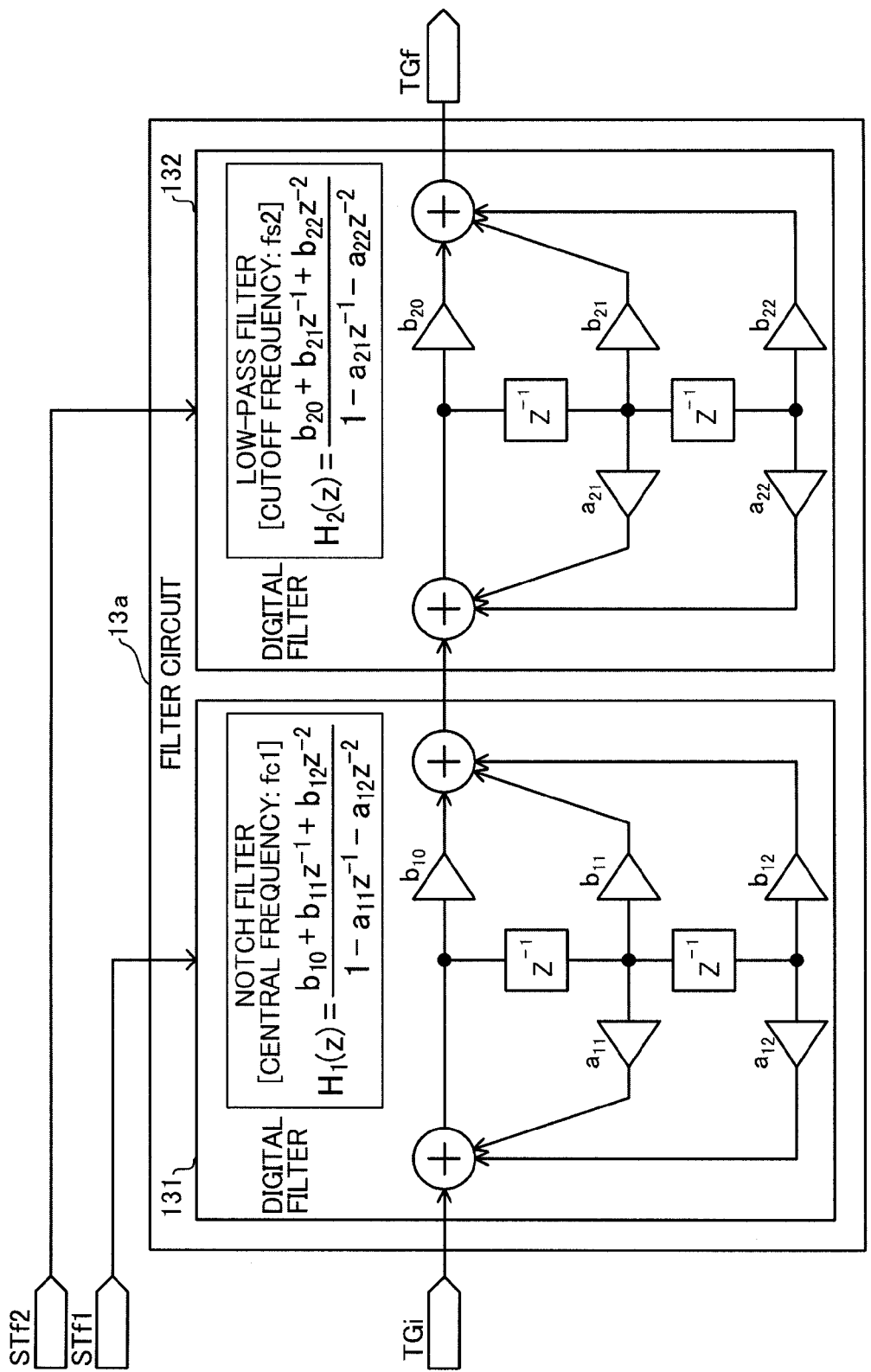
FIG. 2 is a circuit block diagram illustrating an example of a specific configuration of a filter circuit.

As illustrated in FIG. 2, the filter circuit 13a includes digital filters 131 and 132. FIG. 2 illustrates, as an example, the digital filters 131 and 132 configured as known secondary IIR (Infinite Impulse Response) filter.

The target current signal TGi and the filter setting information STf1 are inputted to the digital filter 131. An output signal of the digital filter 131 and the filter setting information STf2 are inputted to the digital filter 132, and a (filtered) target current signal TGf is outputted from the digital filter 132. The target current signals TGi and TGf are inputted to the DAC 14, and a current control signal CNi is outputted from the DAC 14.

The driving circuit 15a includes an Op-Amp (Operational Amplifier) 151 and an NMOS (N-channel Metal-Oxide Semiconductor) transistor 152, for example. The current control signal CNi is inputted to a non-inverting input of the operational amplifier 151, and an inverting input is connected to a source of the NMOS transistor 152. Further, a drain of the NMOS transistor 152 is connected to the terminal 22, a source thereof is connected to the terminal 23 through the resistor 16, and an output signal of the operational amplifier 151 is inputted to a gate thereof. The voice coil motor 3 with one end connected to the power supply potential VCC is connected to the terminal 22, and the terminal 23 is connected to a ground potential.

===Operation of Motor Drive Circuit===

Subsequently, an operation of the motor drive circuit according to an embodiment of the present invention will be described.

The control circuit 11 is configured to output the target current signal TGi, the mode selection signal SLm, and the filter setting information STf1 and STf2 on the basis of the control information INFcn that is inputted from the microcomputer 5.

Here, the target current signal TGi corresponds to a digital signal indicating a target value of a driving current Ivcm that is supplied to the voice coil motor 3. The mode selection signal SLm corresponds to a signal to select a measurement mode (first mode) or a control mode (second mode), which will be described later. With regard to the mode selection signal SLm, it is assumed that SLm=0 indicates the measurement mode and SLm=1 indicates the control mode.

Further, the filter setting information STf1 and STf2 correspond to information to set characteristics of the digital filters 131 and 132, respectively. Specifically, the filter setting information STf1 corresponds to information to set a coefficient with which the digital filter 131 functions as a notch filter. On the other hand, the filter setting information STf2 corresponds to information to set a coefficient with which the digital filter 132 functions as a low-pass filter. The filter setting information STf1 and STf2 may include information to set other characteristics such as sampling frequencies of the digital filters 131 and 132, respectively, for example.

The selection circuit 12 is configured to supply the target current signal TGi that is inputted from the control circuit 11 to the DAC 14 when SLm=0 (measurement mode), and to supply the target current signal TGi to the filter circuit 13a when SLm=1 (control mode).

The digital filter 131 of the filter circuit 13a is configured to attenuate the frequency band, which is determined in accordance with the coefficient that is set by the filter setting information STf1, in the target current signal TGi. More specifically, the digital filter 131 is configured to function as a notch filter and attenuate the frequency band around a frequency fc1 (center frequency). The digital filter 132 is configured to attenuate the frequency band that is determined in accordance with the coefficient that is set by the filter setting information STf2 in the output signal of the digital filter 131. More specifically, the digital filter 132 is configured to function as a low-pass filter, attenuate the frequency band greater than or equal to the frequency fc2 (cutoff frequency), and output the (filtered) target current signal TGf.

The DAC 14 is configured to convert the target current signal TGi (when SLm=0) or TGf (when SLm=1) into an analog signal, and generate the current control signal CNi. The operational amplifier 151 is configured to compare the voltage of the current control signal CNi with the voltage Vvcm at a connection point of the NMOS transistor 152 and the resistor 16, and moreover the gate voltage of the NMOS transistor 152 changes in accordance with the comparison result.

Here, assuming that the resistance value of the resistor 16 is R, the driving current Ivcm is detected as the voltage Vvcm=Ivcm×R. Therefore, the driving circuit 15a is configured to control the voltage Vvcm so as to become equal to the voltage of the current control signal CNi, and the current value of the driving current Ivcm is controlled so as to become a current value indicated by the current control signal CNi.

As such, the motor drive circuit 1a converts the target current signal TGi in the measurement mode and the target current signal TGf in the control mode into analog signals, respectively, to generate the current control signal CNi. Then, the circuit supplies the driving current Ivcm to the voice coil motor 3 in accordance with the current control signal CNi.

===Specific Examples of Operations of Motor Drive Circuit and Actuator===

Here, specific examples of operations of the motor drive circuit and the actuator in the measurement mode and the control mode will be described.

Figure 3:
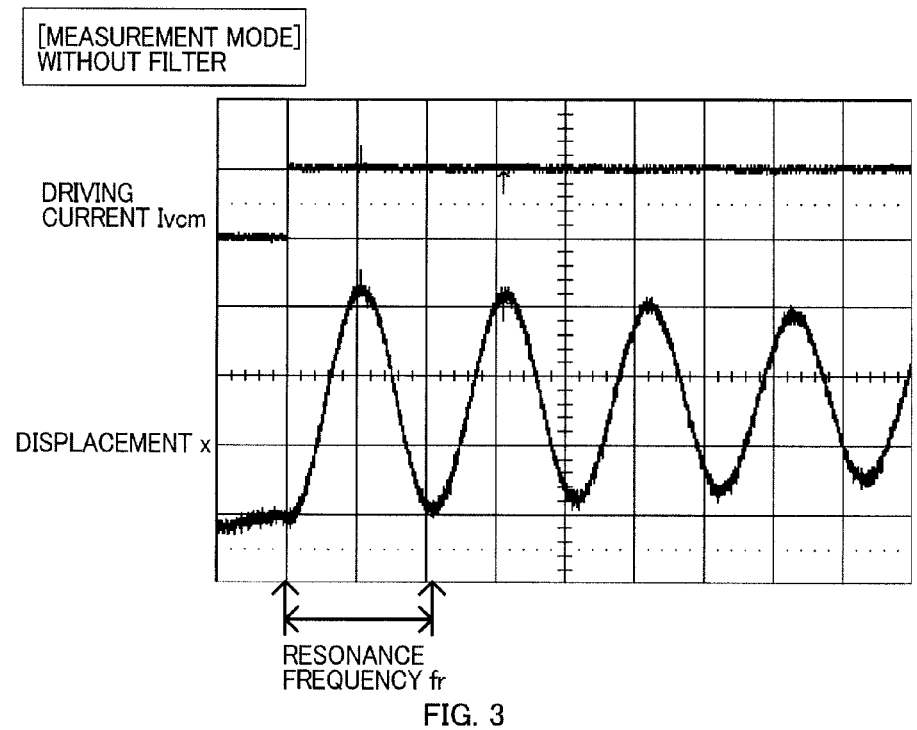
FIG. 3 is a schematic diagram illustrating an example of a driving current Ivcm and displacement x in a measurement mode.

First, with reference to FIG. 3, an operation in the measurement mode will be described. The measurement mode corresponds to a mode in which a resonance frequency fr of the actuator driven by the voice coil motor 3 is measured.

In the measurement mode, the control circuit 11 is configured to output a step signal as the target current signal TGi on the basis of the control information INFcn. The target current signal TGi is supplied to the DAC 14 through the selection circuit 12, and is converted into the current control signal CNi, which is an analog signal. And the driving current Ivcm is controlled on the basis of the current control signal CNi. Therefore, as illustrated in FIG. 3, a current value of the driving current Ivcm changes in a stepped manner.

In this case, the driving circuit 15a controls the voltage Vvcm so as to be equal to the step voltage of the current control signal CNi. Displacement x of the movable part vibrates due to an inertia force of the movable part of the actuator and a restoring force of a spring, and gradually converges to a target position corresponding to the target current signal TGi. Then, the displacement x is measured, and such measurement data is spectrally analyzed, thereby obtaining the resonance frequency fr.

Subsequently, an operation in the control mode will be described with reference to FIGS. 4 to 12 as appropriate. The control mode corresponds to a mode in which the actuator is driven under control of the microcomputer 5.

In the control mode, the control circuit 11 outputs the target current signal TGi, which changes in a stepped manner in accordance with the target position of the movable part of the actuator, on the basis of the control information INFcn. Hereinafter, a description will be given of a case where the same step signal as in the measurement mode is outputted as the target current signal TGi, for the purpose of comparison with the operation in the measurement mode.

The target current signal TGi is supplied to the DAC 14 as the target current signal TGf through the selection circuit 12 and the filter circuit 13a, to be converted into an analog signal. Therefore, in the control mode, the driving circuit 15a supplies the driving current Ivcm to the voice coil motor 3 in accordance with the current control signal CNi which has been filtered by the filter circuit 13a.

As described above, the frequency bands to be attenuated by the digital filters 131 and 132 of the filter circuit 13a are determined in accordance with the coefficients that are set by the filter setting information STf1 and STf2, respectively.

Figure 4:
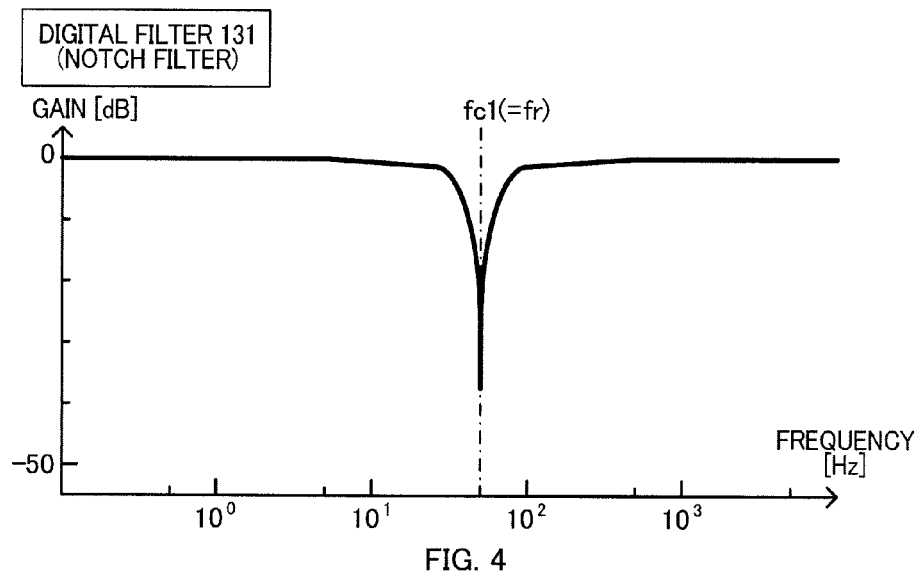
FIG. 4 is a schematic diagram illustrating an example of a notch filter used in a digital filter 131 in a control mode.

FIG. 4 illustrates an example of frequency characteristics of the digital filter 131 for which the coefficient is set so that the filter functions as a notch filter. Here, the central frequency fc1 of the notch filter is set at a frequency equal to the resonance frequency fr that has been measured in advance in the measurement mode. Therefore, the notch filter attenuates the frequency band around the resonance frequency fr in the input signal.

Figure 5:
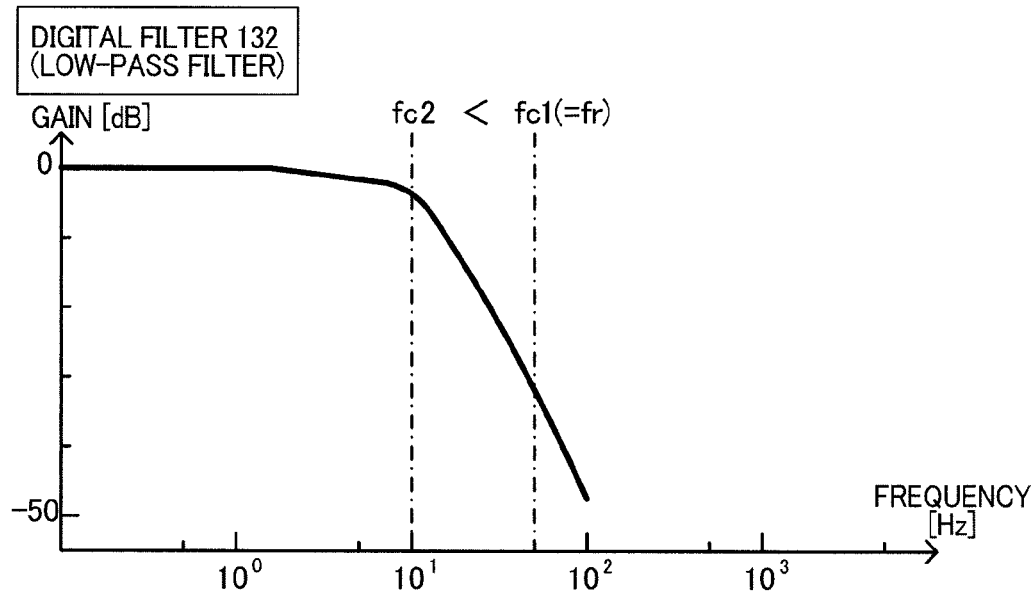
FIG. 5 is a schematic diagram illustrating an example of a low-pass filter used in a digital filter 132 in a control mode.

On the other hand, FIG. 5 illustrates an example of frequency characteristics of the digital filter 132, for which the coefficient is set such that the filter functions as a low-pass filter. Here, a cutoff frequency fc2 of the low-pass filter is set at a frequency lower than the central frequency fc1 (=fr) of the notch filter. Therefore, the low-pass filter attenuates the frequency band greater than or equal to the predetermined frequency fc2 that is lower than the resonance frequency fr, in the input signal.

Figure 6:
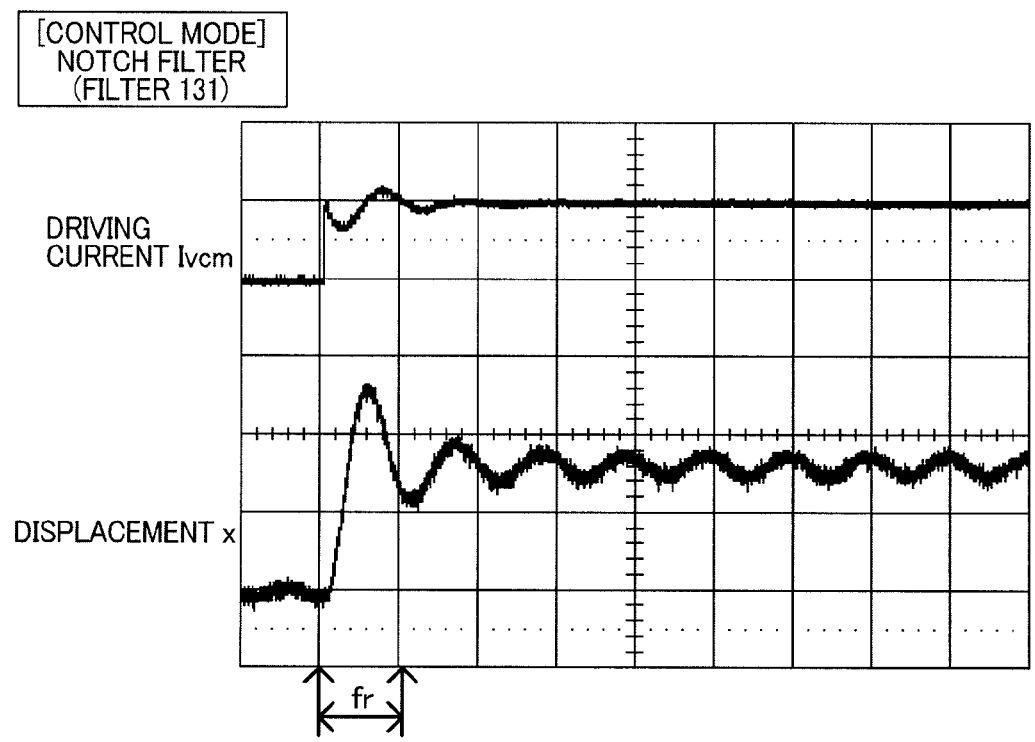
FIG. 6 is a diagram illustrating an example of a driving current Ivcm and the displacement x in a case where only a notch filter illustrated in FIG. 4 is used.

FIG. 6 illustrates an example of the driving current Ivcm and the displacement x in a case where only the notch filter illustrated in FIG. 4 is used. As illustrated in FIG. 6, the frequency band including the resonance frequency fr is attenuated in the step signal (the target current signal TGi) using the notch filter, thereby being able to converge the displacement x in a more rapid manner as compared with the case of the measurement mode (no filter) illustrated in FIG. 3. However, the displacement x overshoots the target position when the driving current Ivcm changes, and small vibration caused by such overshoot remains.

Figure 7:
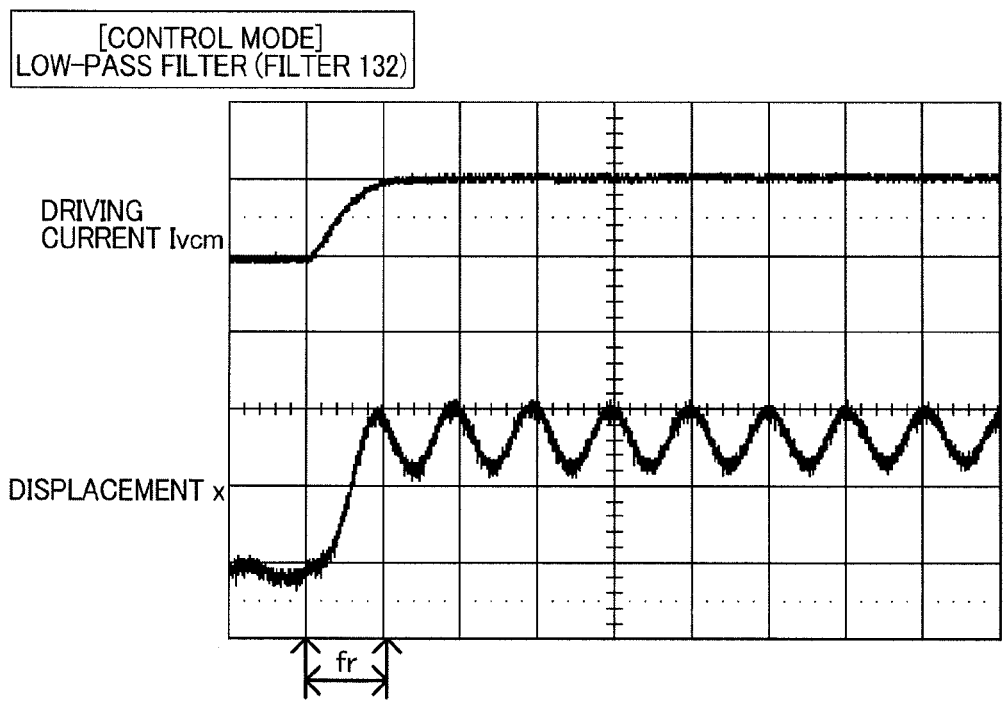
FIG. 7 is a diagram illustrating an example of a driving current Ivcm and displacement x in a case where only a low-pass filter illustrated in FIG. 5 is used.

On the other hand, FIG. 7 illustrates an example of the driving current Ivcm and the displacement x in a case where only the low-pass filter illustrated in FIG. 5 is used. As illustrated in FIG. 7, if the low-pass filter is used, such an overshoot as illustrated in FIG. 6 does not occur. However, larger vibration, as compared with the case where the notch filter is used, remains in the displacement x.

Figure 8:
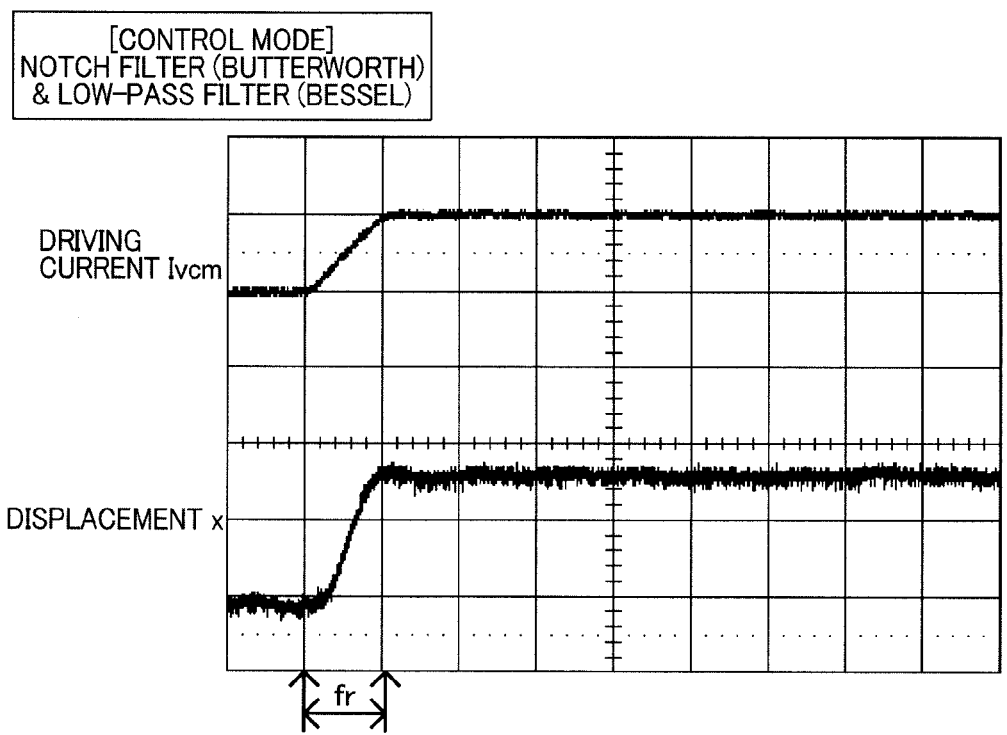
FIG. 8 is a diagram illustrating an example of a driving current Ivcm and displacement x in a case where both a notch filter and a low-pass filter are used, in a control mode.

Whereas, in the motor drive circuit 1a according to an embodiment of the present invention, both the notch filter and the low-pass filter are cascade-connected, thereby making up the filter circuit 13a. FIG. 8 illustrates an example of the driving current Ivcm and the displacement x in a case where both the notch filter and the low-pass filter are used, in the control mode. As illustrated in FIG. 8, both the notch filter and the low-pass filter are used, thereby being able to suppress the overshoot, and the position of the movable part (displacement x) can be converged/stabilized in a rapid manner. In this case, the driving current Ivcm is in a ramp waveform at rising (or falling), and thereafter, becomes such a waveform as to cancel natural frequency of the movable part.

In an embodiment of the present invention, it is preferable that a Butterworth filter is used as the notch filter and a Bessel filter is used as the low-pass filter.

Figure 9:
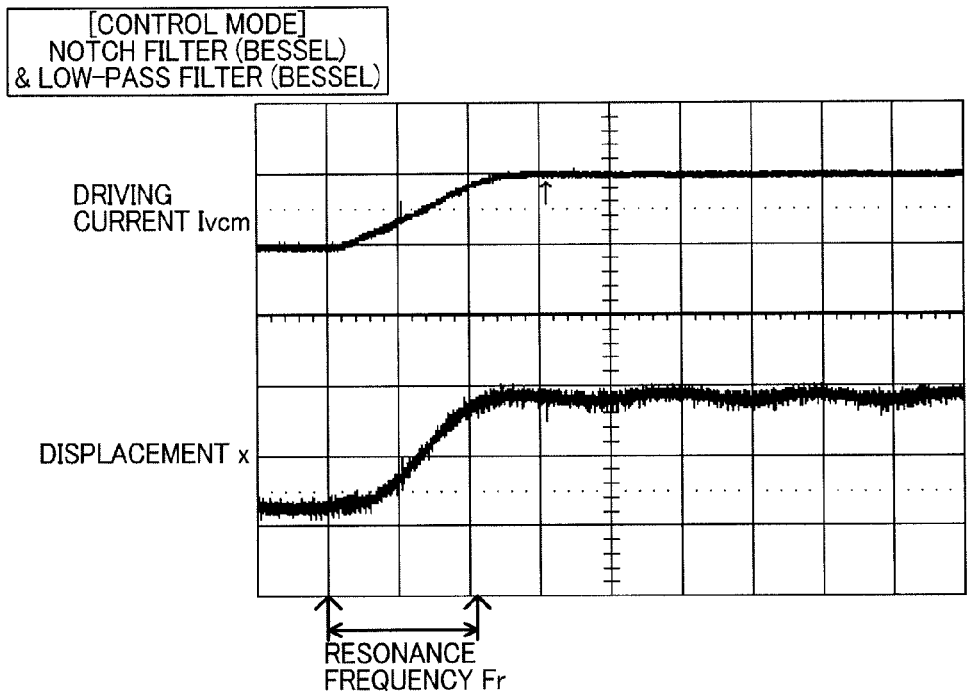
FIG. 9 is a diagram illustrating an example of a driving current Ivcm and displacement x in a case where a Bessel filter is used as a notch filter.
Figure 10:
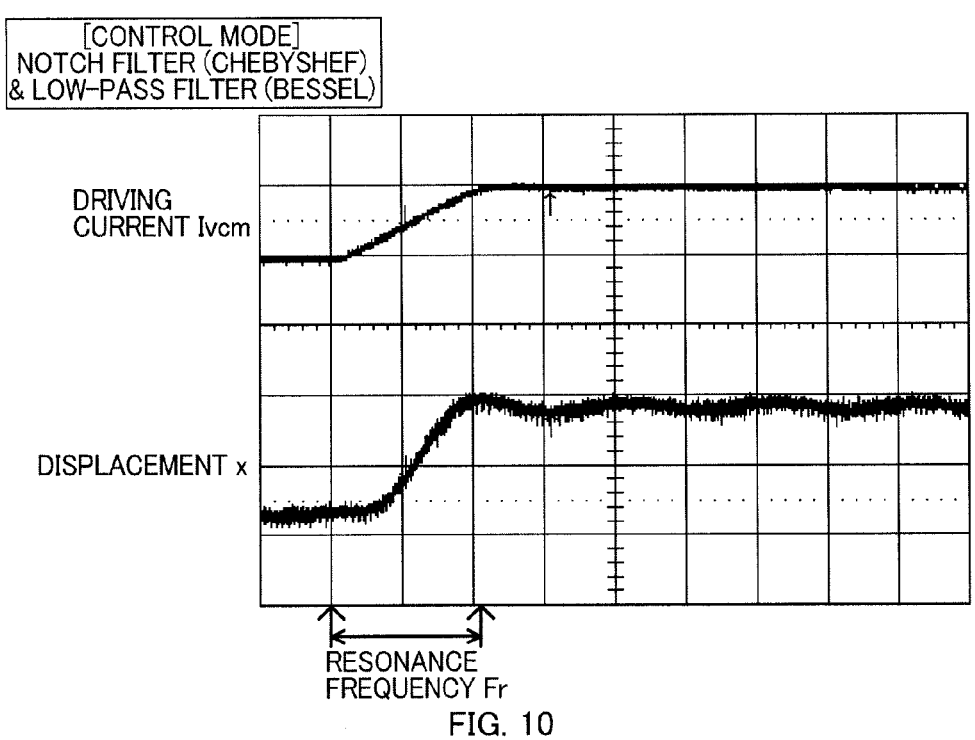
FIG. 10 is a diagram illustrating an example of a driving current Ivcm and displacement x in a case where a Chebyshev filter is used as a notch filter.

If a Bessel filter or a Chebyshev filter is used as the notch filter, for example, as illustrated in FIG. 9 or FIG. 10, some ripples remain in the displacement x. The ripples can be suppressed by minimizing the ripples in a pass band, that is to say, by using a Butterworth filter, whose frequency characteristics in a pass band is maximally flat, as the notch filter.

Figure 11:
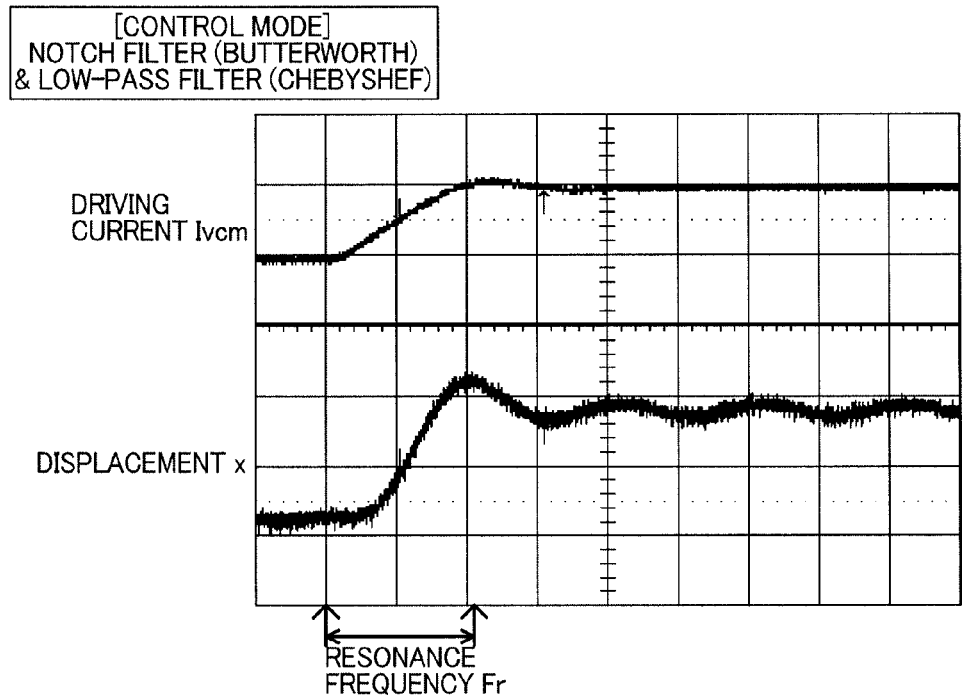
FIG. 11 is a schematic diagram illustrating an example of a driving current Ivcm and displacement x in a case where a Chebyshev filter is used as a low-pass filter.
Figure 12:
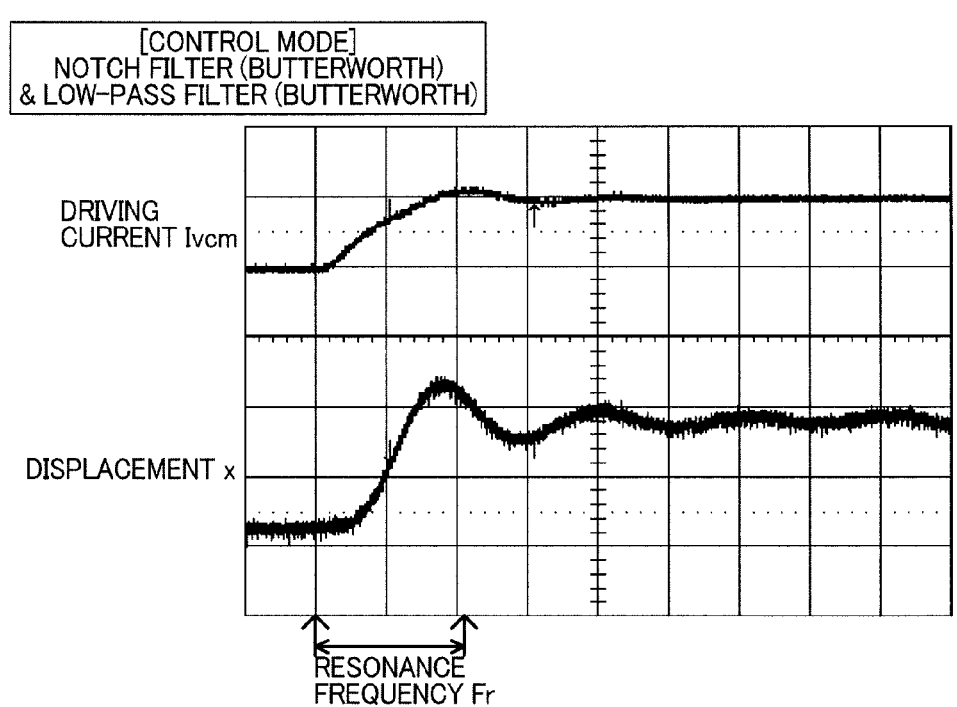
FIG. 12 is a diagram illustrating an example of a driving current Ivcm and displacement x in a case where a Butterworth filter is used as a low-pass filter.

Further, for example, in a case where a Chebyshev filter or a Butterworth filter is used as the low-pass filter, as well, as illustrated in FIGS. 11 and 12, respectively, some ripples remain in the displacement x. The ripples can be suppressed by minimizing the overshoot or ringing in a step response in the pass band, that is to say, by using a Bessel filter, whose group delay in the pass band is maximally flat, as the low-pass filter.

===Another Configuration Example of Motor Drive Circuit===

Figure 13:
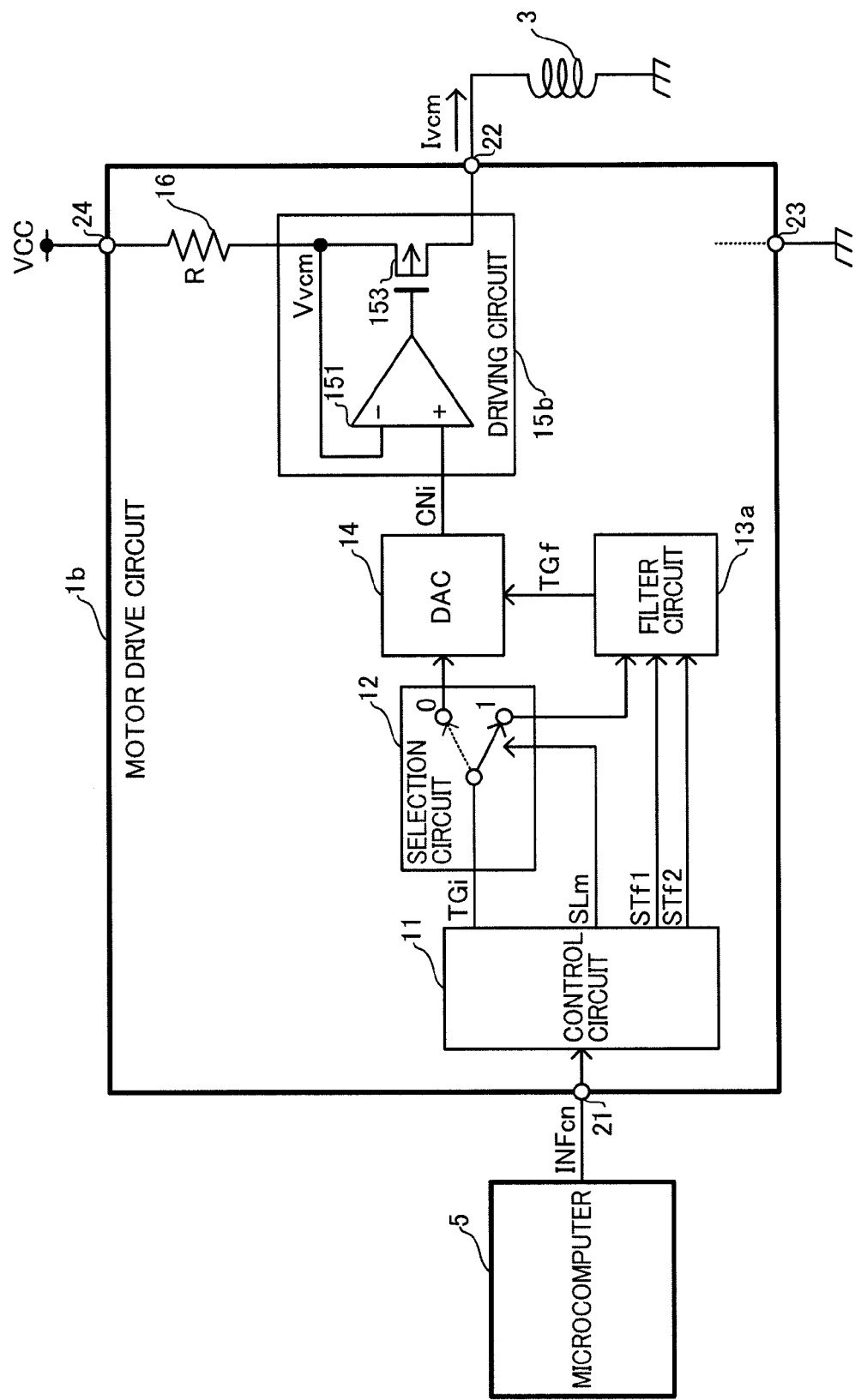
FIG. 13 is a circuit block diagram illustrating another configuration example of a motor drive circuit.

In an embodiment of the present invention, the driving circuit 15a of the motor drive circuit 1a controls the driving current Ivcm using the NMOS transistor 152, but it is not limited thereto. For example, as illustrated in FIG. 13, it may be so configured that the power supply potential VCC and the ground potential are inverted in polarity by using the PMOS (P-channel MOS: P-channel Metal-Oxide Semiconductor) transistor 153.

In the motor drive circuit 1a, a large current flows if the voice coil motor 3 is short-circuited to the ground potential, but the motor drive circuit 1b illustrated in FIG. 13 is configured such that a large current does not flow when short circuit to the ground potential occurs. Also, in the motor drive circuit 1b, a large current flows if the voice coil motor 3 is short-circuited to the power supply potential VCC, however, since a terminal or wiring of the power supply potential VCC is usually arranged not around the voice coil motor 3, short circuit to the power supply potential VCC hardly occurs. Further, by setting the terminal 23 of the motor drive circuit 1b and one end of the voice coil motor 3 at the common ground potential, wiring can be simplified.

On the other hand, in the motor drive circuit 1a, a size of transistor can be reduced to be smaller than that of the PMOS transistor 153 by using the NMOS transistor 152.

===Another Configuration Example of Filter Circuit===

In an embodiment of the present invention, the filter circuit 13a is configured using the two cascade-connected digital filters 131 and 132, but it is not limited thereto. For example, as illustrated in FIG. 14, the circuit can be configured using a time-division controlled single digital filter 133.

Figure 14:
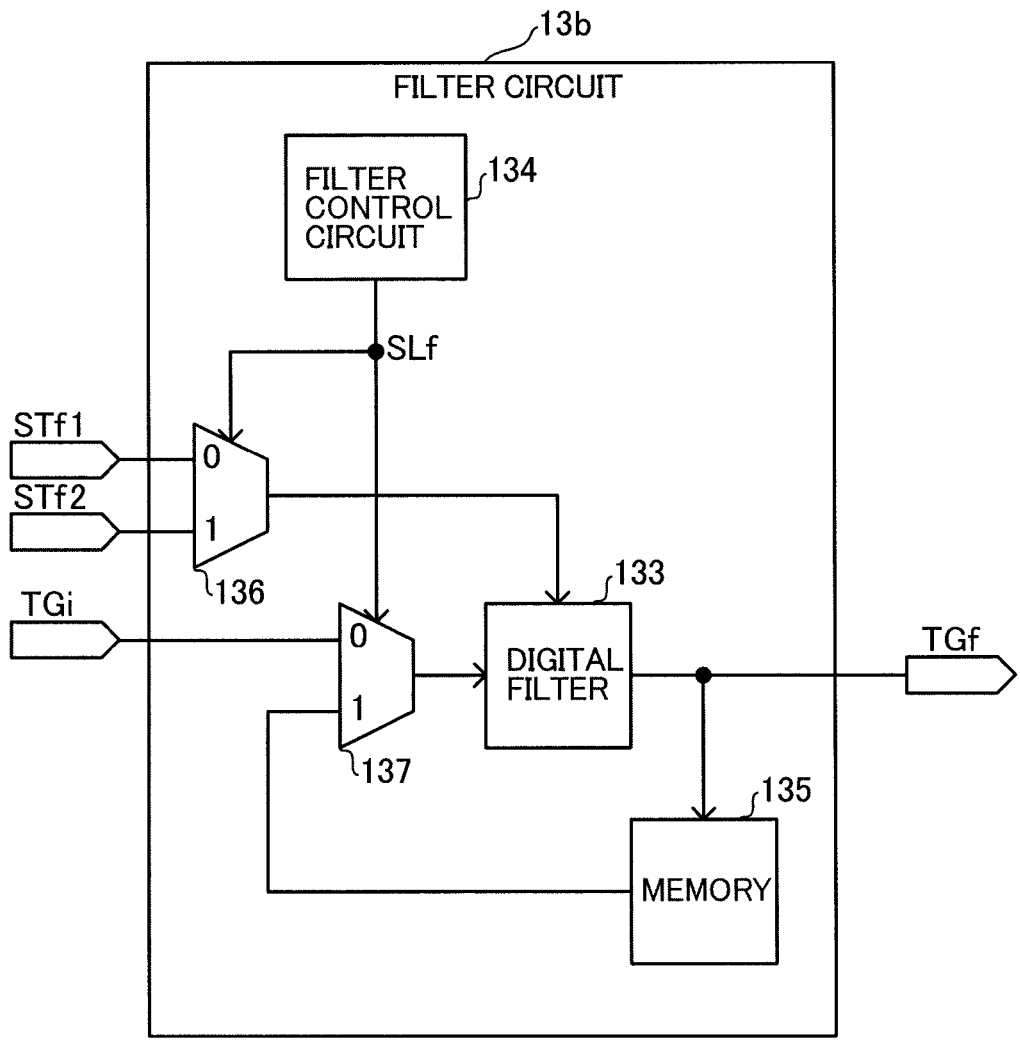
FIG. 14 is a circuit block diagram illustrating another configuration example of a filter circuit.

The filter circuit 13b illustrated in FIG. 14 includes the digital filter 133, a filter control circuit 134, a memory 135, and multiplexers (selection circuits) 136 and 137. Also, the multiplexer 136 selects the filter setting information STf1 or STf2 in a time division manner in accordance with a filter selection signal SLf that is outputted from the filter control circuit 134. Further, the multiplexer 137 selects the target current signal TGi or an output signal of the digital filter 133 which is stored in the memory 135 in a time division manner in accordance with the filter selection signal SLf.

As such, during a first period when SLf=0, the digital filter 133 can be caused to function as a notch filter, which is similar to the digital filter 131 whereto the target current signal TGi is inputted. On the other hand, during a second period when SLf=1, the digital filter 133 can be caused to function as a low-pass filter, which is similar to the digital filter 132 whereto an output signal of the notch filter is inputted.

The filter circuits 13a and 13b are configured with such a cascade-connection that an output signal of the notch filter is inputted to the low-pass filter, but this is not limited thereto. For example, by causing the digital filters 131 and 132 to function as the low-pass filter and the notch filter, respectively, a filter circuit can be configured with such a cascade-connection that the output signal of the low-pass filter is inputted to the notch filter. Also, for example, by causing the digital filter 133 to function as the low-pass filter and the notch filter in the first and second periods, respectively, as well, the filter circuit can be configured with the similar cascade-connection.

As described above, in the motor drive circuit 1a, the digital (notch) filter 131 with the central frequency fc1 is caused to attenuate the frequency band around the resonance frequency fr of the actuator in the target current signal TGi, by causing the digital (low-pass) filter 132 with the cutoff frequency fc2 (<fc1) to attenuate the frequency band greater than or equal to a predetermined frequency, and by supplying the driving current Ivcm to the voice coil motor 3 in accordance with the filtered current control signal CNi, convergence time for the vibration to converge can be reduced regardless of the resonance frequency of the actuator.

Further, by using a Butterworth filter, whose frequency characteristics in the pass band is flat, as the digital (notch) filter 131, output ripples can be suppressed as compared with a case where a Bessel filter or a Chebyshev filter is used.

Further, by using a Bessel filter, whose group delay is substantially constant in the pass band, as the digital (low-pass) filter 132, output ripples can be suppressed as compared with a case where a Chebyshev filter or a Butterworth filter is used.

Further, in the measurement mode, by supplying the step signal to the DAC 14 as the target current signal TGi and measuring the resonance frequency fr of vibration in the step response in advance, the frequency band, which is to be attenuated by the filter circuit 13a, can be set in accordance with the measured resonance frequency fr in the control mode.

Further, by using the digital filter 133 under time-division control, functions of the cascade-connected notch filter and low-pass filter can be realized by one digital filter, and a circuit size can be reduced.

In an embodiment of the present invention as described above, the resonance frequency fr of the actuator that is driven by the voice coil motor 3 is measured in the measurement mode, but an embodiment according to the present invention is not limited thereto, and the measurement mode does not have to be provided.

The above embodiments of the present invention are simply for facilitating the understanding of the present invention and are not in anyway to be construed as limiting the present invention. The present invention may variously be changed or altered without departing from its spirit and encompass equivalents thereof.

What is claimed is:

1. A motor drive circuit comprising:
a filter circuit configured to attenuate a frequency band including a resonance frequency of an actuator in a target current signal, the target current signal corresponding to a digital signal indicative of a target value of a driving current to be supplied to a voice coil motor configured to drive the actuator;
a digital-analog converter configured to convert an output signal of the filter circuit into an analog signal, to be outputted as a current control signal; and
a driving circuit configured to supply the driving current to the voice coil motor in accordance with the current control signal,
the filter circuit including:
a digital notch filter configured to attenuate a frequency band around the resonance frequency in the input signal; and
a digital low-pass filter configured to attenuate a frequency band greater than or equal to a predetermined frequency in the input signal, the predetermined frequency corresponding to a frequency lower than the resonance frequency,
either one of the digital notch filter and the digital low-pass filter configured to be inputted with the target current signal,
an other one of the digital notch filter and the digital low-pass filter configured to be inputted with an output signal of the one of the digital notch filter or the digital low-pass filter.

2. The motor drive circuit according to claim 1, wherein the digital notch filter includes a Butterworth filter.

3. The motor drive circuit according to claim 1, wherein the digital low-pass filter includes a Bessel filter.

4. The motor drive circuit according to claim 2, wherein the digital low-pass filter includes a Bessel filter.

5. The motor drive circuit according to claim 1, further comprising:
a selection circuit configured to be inputted with a step signal as the target current signal in accordance with a mode selection signal, the selection circuit configured to select either one of a first mode, in which the step signal is supplied to the digital-analog converter, and a second mode, in which the inputted target current signal is supplied to the filter circuit, wherein
the digital-analog converter is configured to convert the step signal into an analog signal, to be outputted as the current control signal, in the first mode; and
the filter circuit has the frequency band to be attenuated set therefor in accordance with the resonance frequency in the second mode, the resonance frequency measured in advance in the first mode.

6. The motor drive circuit according to claim 2, further comprising:
a selection circuit configured to be inputted with a step signal as the target current signal in accordance with a mode selection signal, the selection circuit configured to select either one of a first mode, in which the step signal is supplied to the digital-analog converter, and a second mode, in which the inputted target current signal is supplied to the filter circuit, wherein
the digital-analog converter is configured to convert the step signal into an analog signal, to be outputted as the current control signal, in the first mode; and
the filter circuit has the frequency band to be attenuated set therefor in accordance with the resonance frequency in the second mode, the resonance frequency measured in advance in the first mode.

7. The motor drive circuit according to claim 3, further comprising:
a selection circuit configured to be inputted with a step signal as the target current signal in accordance with a mode selection signal, the selection circuit configured to select either one of a first mode, in which the step signal is supplied to the digital-analog converter, and a second mode, in which the inputted target current signal is supplied to the filter circuit, wherein the digital-analog converter is configured to convert the step signal into an analog signal, to be outputted as the current control signal, in the first mode; and the filter circuit has the frequency band to be attenuated set therefor in accordance with the resonance frequency in the second mode, the resonance frequency measured in advance in the first mode.

8. The motor drive circuit according to claim 4, further comprising:

a selection circuit configured to be inputted with a step signal as the target current signal in accordance with a mode selection signal, the selection circuit configured to select either one of a first mode, in which the step signal is supplied to the digital-analog converter, and a second mode, in which the inputted target current signal is supplied to the filter circuit, wherein the digital-analog converter is configured to convert the step signal into an analog signal, to be outputted as the current control signal, in the first mode; and the filter circuit has the frequency band to be attenuated set therefor in accordance with the resonance frequency in the second mode, the resonance frequency measured in advance in the first mode.

9. The motor drive circuit according to claim 1, wherein the filter circuit includes:

a digital filter configured to function as the digital notch filter or the digital low-pass filter;

a selection circuit configured to select a coefficient and an input signal of the digital filter in a time division manner; and a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

10. The motor drive circuit according to claim 2, wherein the filter circuit includes:

a digital filter configured to function as the digital notch filter or the digital low-pass filter;

a selection circuit configured to select a coefficient and an input signal of the digital filter in a time division manner; and a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

11. The motor drive circuit according to claim 3, wherein the filter circuit includes:

a digital filter configured to function as the digital notch filter or the digital low-pass filter;

a selection circuit configured to select a coefficient and an input signal of the digital filter in a time division manner; and a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

12. The motor drive circuit according to claim 4, wherein the filter circuit includes:

a digital filter configured to function as the digital notch filter or the digital low-pass filter;

a selection circuit configured to select a coefficient and an input signal of the digital filter in a time division manner; and a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

13. The motor drive circuit according to claim 5, wherein the filter circuit includes:

a digital filter configured to function as the digital notch filter or the digital low-pass filter;

a selection circuit configured to select a coefficient and an input signal of the digital filter in a time division manner; and a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

14. The motor drive circuit according to claim 6, wherein the filter circuit includes:

a digital filter configured to function as the digital notch filter or the digital low-pass filter;

a selection circuit configured to select a coefficient and an input signal of the digital filter in a time division manner; and a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

15. The motor drive circuit according to claim 7, wherein the filter circuit includes:
- a digital filter configured to function as the digital notch filter or the digital low-pass filter;
- a selection circuit configured to select a coefficient and an input signal of the digital filter in a time division manner; and
- a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

16. The motor drive circuit according to claim 8, wherein the filter circuit includes:
- a digital filter configured to function as the digital notch filter or the digital low-pass filter;
- a selection circuit configured to select a coefficient and an input signal of the digital filter in a time division manner; and
- a memory configured to store an output signal of the digital filter, wherein the selection circuit is configured to select the coefficient so that the digital filter functions as the one of the digital notch filter and the digital low-pass filter, and supply the target current signal to the digital filter, in the first period; and the selection circuit is configured to select the coefficient so that the digital filter functions as the other one of the digital notch filter and the digital low-pass filter, and supply the signal stored in the memory in the first period to the digital filter, in the second period.

* * * * *